United States Patent
Lu (10) Patent No.: US 6,448,910 B1
(45) Date of Patent: Sep. 10, 2002

(54) METHOD AND APPARATUS FOR CONVOLUTION ENCODING AND VITERBI DECODING OF DATA THAT UTILIZE A CONFIGURABLE PROCESSOR TO CONFIGURE A PLURALITY OF RE-CONFIGURABLE PROCESSING ELEMENTS

(75) Inventor: Guangming Lu, Irvine, CA (US)

(73) Assignee: Morpho Technologies, Irvine, CA (US)

( * ) Notice: Subject to any disclaimer, the term of this patent is extended or adjusted under 35 U.S.C. 154(b) by 0 days.

(21) Appl. No.: 09/818,746

(22) Filed: Mar. 26, 2001

(51) Int. Cl.[7] ............................................. H03M 7/38
(52) U.S. Cl. .......................... 341/51; 341/50; 341/81; 341/107; 375/341; 375/340; 375/262; 375/240; 375/354; 714/786; 714/789; 714/794; 714/769; 714/795
(58) Field of Search ............................... 341/51, 81, 50, 341/107; 375/341, 340, 262, 240, 354; 714/786, 789, 794, 769, 795

(56) References Cited

U.S. PATENT DOCUMENTS

| | | | |
|---|---|---|---|
| 4,905,317 A | * 2/1990 | Suzuki et al. ................... 341/51 |
| 5,406,570 A |   4/1995 | Berrou et al. |
| 5,436,918 A | * 7/1995 | Kato et al. .................... 714/795 |
| 5,555,547 A |   9/1996 | Lemaitre et al. |
| 5,724,394 A | * 3/1998 | Ikeda et al. ................... 329/345 |
| 5,875,214 A |   2/1999 | Urbaniak et al. |
| 6,301,684 B1 | * 10/2001 | Watanabe et al. ............ 375/232 |
| 6,310,887 B1 | * 10/2001 | Hatakeyama ................ 370/320 |
| 6,337,890 B1 | * 1/2002 | Maru .......................... 375/262 |
| 6,343,105 B1 | * 1/2002 | Saegusa ....................... 375/341 |

\* cited by examiner

Primary Examiner—Michael Tokar
Assistant Examiner—Lam T. Mai
(74) Attorney, Agent, or Firm—O'Melveny & Myers LLP (57) ABSTRACT

A method and apparatus for convolution encoding and Viterbi decoding utilizes a flexible, digital signal processing architecture that comprises a core processor and a plurality of re-configurable processing elements arranged in a two-dimensional array. The core processor is operable to configure the re-configurable processing elements to perform data encoding and data decoding functions. A received data input is encoded by configuring one of the re-configurable processing elements to emulate a convolution encoding algorithm and applying the received data input to the convolution encoding algorithm. A received encoded data input is decoded by configuring the plurality of re-configurable processing elements to emulate a Viterbi decoding algorithm wherein the plurality of re-configurable processing elements is configured to accommodate every data state of the convolution encoding algorithm. The core processor initializes the re-configurable processing elements by assigning register values to registers that define parameters such as constraint length and code rate for the convolution encoding algorithm.

20 Claims, 12 Drawing Sheets

METHOD AND APPARATUS FOR CONVOLUTION ENCODING AND VITERBI DECODING OF DATA THAT UTILIZE A CONFIGURABLE PROCESSOR TO CONFIGURE A PLURALITY OF RE-CONFIGURABLE PROCESSING ELEMENTS

BACKGROUND OF THE INVENTION

1. Field of the Invention

The present invention relates to digital signal processing, and more particularly to the mapping of a convolution encoder and a Viterbi decoder onto a dynamically re-configurable two-dimensional single instruction multiple data (SIMD) processor array architecture.

2. Description of Related Art

The field of digital signal processing (DSP) has grown dramatically in recent years and has quickly become a key component in many consumer, communications, medical, and industrial products. DSP technology involves the analyzing and processing of digital data in the form of sequences of ones and zeros. In the field of communications, analog signals are converted to such digital sequences for processing and transmission. During transmission, however, these digital sequences may be easily distorted by noise. In order to address this problem, digital data is often encoded before transmission. One form of encoding, known as convolution encoding, is widely used in digital communication and signal processing to protect transmitted data against noise, and its efficiency is well known in terms of error correction quality. In general, convolution encoding is a coding scheme that associates at least one encoded data element with each source data element to be encoded, this encoded data element being obtained by the modulo-two summation of this source data element with at least one of the previous source data elements. Thus, each encoded symbol is a linear combination of the source data element to be encoded and the previous source data elements.

Figure 1A:
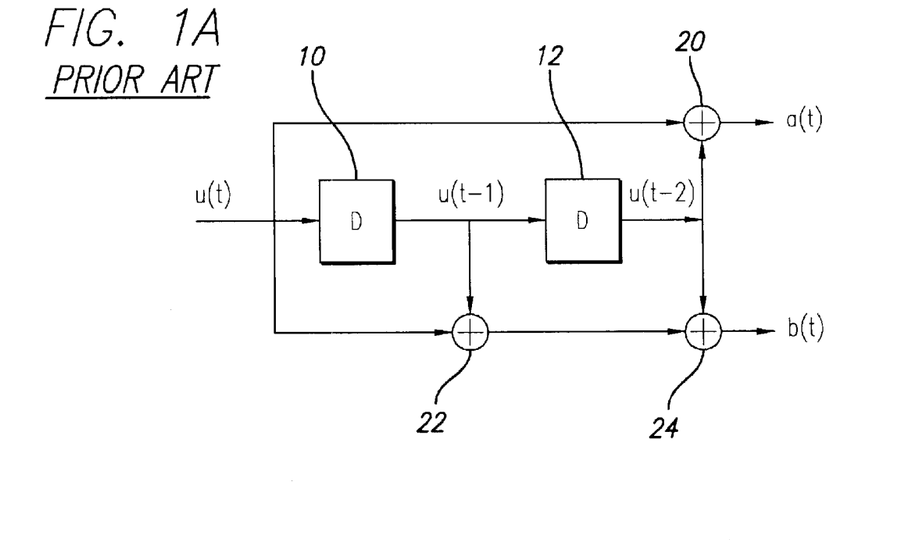
FIG. 1A is a schematic diagram of a convolution encoder having a code rate of one half.

In FIG. 1A, a schematic diagram of a standard convolution encoder with a code rate of one half is shown. For this type of encoder, two encoding outputs, a(t) and b(t), are transmitted for every input u(t). The encoder is shown to be comprised of two delay elements, 10 and 12, and three exclusive-OR Boolean operators 20, 22, and 24. As illustrated, an input u(t) is connected to a first delay element 10, a first exclusive-OR operator 20, and a second exclusive-OR operator 22. The output u(t−1) of the first delay element 10 is connected to the input of the second delay element 12 and to the second exclusive-OR operator 22. The output u(t−2) of the second delay element 20 is then connected to the first exclusive-OR operator 20 and to the third exclusive-OR operator 24. The encoding outputs, a(t) and b(t), are then respectively taken from the outputs of the first exclusive-OR operator 20 and the third exclusive-OR operator 24. It should be appreciated that there are four possible binary states of the encoder (u(t−1), u(t−2)), including state zero (00), state one (01), state two (10), and state three (11).

Figure 1B:
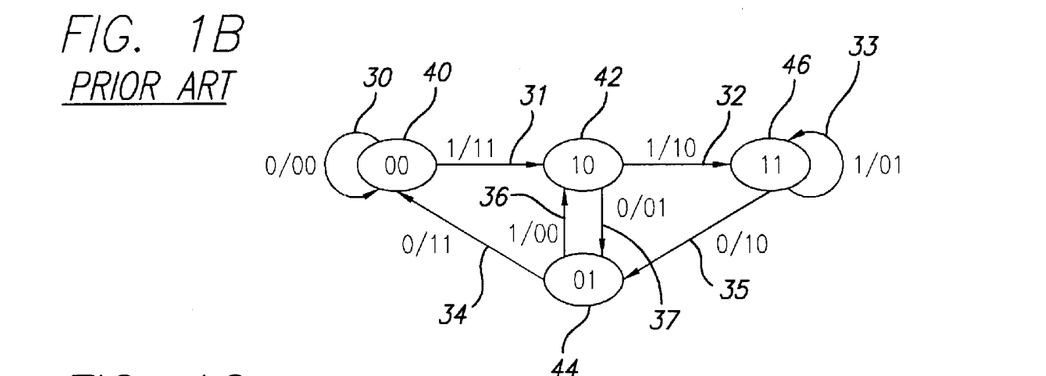
FIG. 1B is a schematic diagram of a finite state machine of an encoder having a code rate of one half.

The encoding process of the described encoder may also be characterized by the finite state machine illustrated in FIG. 1B. In this diagram, each circle is labeled with a binary representation of one of the four binary states of the encoder. In particular, this diagram provides binary representations for state zero 40, state one 44, state two 42, and state three 46. This diagram is further comprised of several arrows representing the respective transition paths taken into each particular state. In this example, a total of eight transition paths 30, 31, 32, 33, 34, 35, 36, and 37 are illustrated. Each transition path also includes an input/output pair (u(t)/a(t), b(t)) uniquely identifying the conditions needed for that particular transition to occur.

For example, beginning at state zero 40, there are two possible transition paths, including path 30 and path 31. Path 30 depicts an input u(t) of zero that produces respective outputs a(t), b(t) of zero, zero (0/00), thereby causing the finite state machine to remain at state zero 40 (or 00). Path 31 depicts an input u(t) of one and respective outputs a(t), b(t) of one, one (1/11), thereby causing the finite state machine to transition to state two 42 (or 10). From state two 42, there are two possible transition paths, including path 32 and path 37. Path 32 depicts an input u(t) of one that produces respective outputs a(t), b(t) of one, zero (1/10), thereby causing the finite state machine to transition to state three 46 (or 11). Path 37 depicts an input u(t) of zero and respective outputs a(t), b(t) of zero, one (0/01), thereby causing the finite state machine to transition to state one 44 (or 01). The remaining transition paths follow in like manner.

Figure 1C:
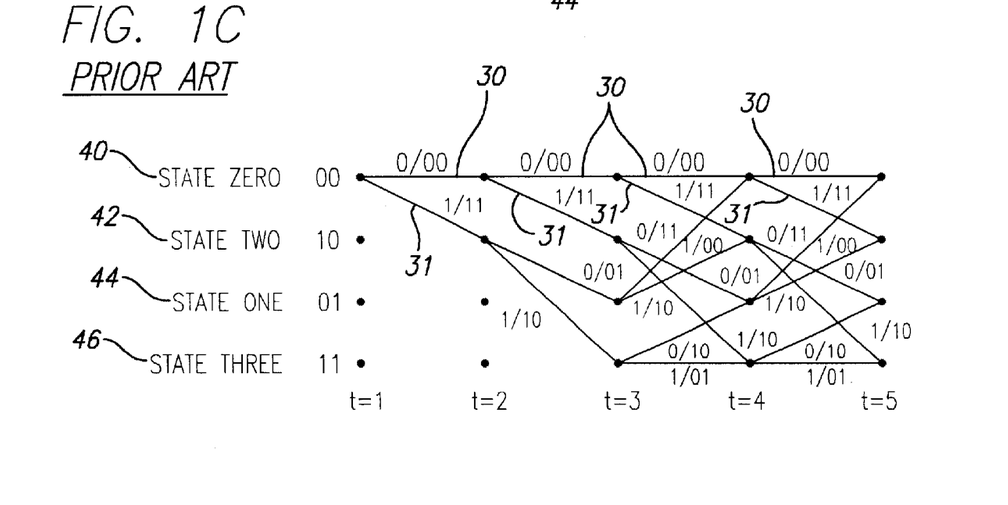
FIG. 1C is a trellis diagram illustrating the possible state transitions of encoded data having a code rate of one half.

In order to depict how the described encoder evolves over time, a trellis diagram is shown in FIG. 1 C. As illustrated, this diagram is comprised of several nodes (denoted by dots) and transition paths (denoted by solid lines). Each column of nodes represents all states at a particular instant. In this particular example, five instants are described (corresponding to t=1 through t=5). Therefore, this trellis diagram can be regarded as illustrating the sequence of all possible state transition paths over five instants (where it is assumed that the initial state is state zero 40). As a result, any given stream of input bits u(t) can be uniquely determined directly from its corresponding sequence of outputs, a(t) and b(t), and information derived from the encoder's trellis diagram. For example, if after four instants the observed noiseless outputs $\{a_1(t)/b_1(t), a_2(t)/b_2(t), a_3(t)/b_3(t), a_4(t)/b_4(t)\}$ at a receiver are $\{11, 10, 10, 00\}$, then the corresponding input sequence $\{u_1(t), u_2(t), u_3(t), u_4(t)\}$ is $\{1, 1, 0, 1\}$ according to the trellis diagram shown in FIG. 1C. In this example, it should be clear that the number of decoded input bits is determined directly from the number of instants traced back in a given trellis diagram. In practice, two trace-back approaches are used. In the first approach, the number of instants traced back in a trellis diagram is equal to the total number of bits in the entire bit stream (resulting in the decoding of the entire bit stream at once). In the second approach, a pre-determined number of instants is used resulting in the decoding of partial bit streams at a time.

In general, noise will occur during transmission. For example, if the observed output sequence is $\{10, 10, 10, 00\}$, the corresponding input sequence is unclear. Thus in practical applications, statistical decoding methods that account for such noise must be implemented. It should be noted that although each transition path 30, 31, 32, 33, 34, 35, 36, and 37 described in FIG. 1B is included in the trellis diagram of FIG. 1C, for simplicity, only transition paths 30 and 31 are labeled.

In the presence of noise, the most commonly used approach to decode convolution codes is via the Viterbi algorithm. In particular, the Viterbi algorithm gives a binary estimation of each input u(t) coded at transmission. This estimation is determined by finding the most likely transition path of a given trellis with respect to the noisy output data (X(t), Y(t)) received by a decoder respectively corresponding to the originally encoded output data (a(t), b(t)). Each node of the trellis used during decoding contains an information element on the survivor path of the two possible paths ending at that particular node. The basic principle of the Viterbi algorithm consists in considering, at each node, only the most probable path as to enable easy trace-back operations on the trellis and hence to determine an a posteriori estimation of the value received several reception instants earlier.

The Viterbi algorithm involves the execution of a particular set of operations. First, a computation is made of the distances, also called branch metrics, between the received noisy output data (X(t), Y(t)) and the symbols (a(t), b(t)) corresponding to the required noiseless outputs of a particular state transition path. In particular these branch metric units are defined as:

$$\text{Branch}(a_s, b_s) = a_s X_k + b_s Y_k$$

where ($a_s$, $b_s$) represent the required noiseless outputs of a particular state transition path and ($X_k$, $Y_k$) represent a received noisy output received at time k (it should be noted that, in the modulation scheme described herein, zero logic values are replaced by negative ones in the right-side of the above formula). For example, suppose a set of incoming data is defined as ($X_0$, $Y_0$), which corresponds to a particular output ($a_0$, $b_0$) of an encoder for a certain input $u_0$ with a code rate of one half. If the trellis shown in FIG. 1C is used (where it is assumed that state zero 40 is the initial state), then the procedure begins by calculating branch metric units for state transition paths 30 and 31 which respectively correspond to the transition from state zero 40 to state zero 40 and the transition from state zero 40 to state two 42 at the first instant (t=1). In particular, these two transition paths, 30 and 31, would have the following two branch metrics:

$$\text{Branch }(0, 0) = -X_0 - Y_0$$

$$\text{Branch }(1, 1) = X_0 + Y_0$$

where Branch (0, 0) describes the branch metric needed to transition from state zero 40 to state zero 40 (where $a_s=0$ and $b_s=0$), and Branch (1, 1) describes the branch metric needed to transition from state zero 40 to state two 42 (where $a_s=1$ and $b_s=1$). A cumulative branch metric is then determined at each node after each instant. In particular, a cumulative branch metric P(s, t) is defined for each node where s represents the state of the node and t represents the instant as:

$$P(j, t) = P(i, t-1) + \text{Branch}_{ij}$$

where P(j, t) represents the cumulative branch metric of state j at instant t, P(i, t−1) represents the cumulative branch metric of a state i preceding state j at instant (t−1), and $\text{Branch}_{ij}$ represents the branch metric needed to transition from state i to state j. The most likely path M(j, t) coming into state j at time instant t is then defined as:

$$M(j, t) = \max\{i^*\}[M_i^*(t-1) + \text{Branch}_{i^*j}]$$

where $\{i^*\}$ represents the set of states having transitions into state j. It should be noted that the above formula is only needed when there are two possible state transition paths into a particular node (otherwise, the most likely path into state j M(j, t) is simply P(j, t)). In the current example, it should thus be clear that this calculation is not needed until the fourth instant (t=4). It should also be noted that, in the current example, it is assumed that all cumulative branch metrics are initially zero. Therefore, P(0, 1) and M(0, 1) are both initialized to zero at the first instant (t=1).

In the next instant (t=2), four branch metric calculations are needed. Namely, the following branches are needed:

$$\text{Branch }(0, 0) = -X_0 - Y_0$$

$$\text{Branch }(0, 1) = -X_0 + Y_0$$

$$\text{Branch }(1, 0) = X_0 - Y_0$$

$$\text{Branch }(1, 1) = X_0 + Y_0$$

The cumulative branch metrics corresponding to the two possible paths for each state are then compared in order to determine the paths most likely taken at this particular instant. The selected paths and the cumulative branch metrics of each state are then both stored in memory until the next instant.

After a pre-determined number of instants, a trace-back operation is made in order to determine the optimal cumulative path taken. In particular, the path with the largest cumulative path metric is chosen as the optimal path (although some implementations use the smallest cumulative path metric). This optimal path is then used to decode the original coded bit stream of information according the procedure described earlier for noiseless conditions.

The Viterbi algorithm has been implemented in the prior art using either hardware or software systems. Software implementations of the Viterbi algorithm adapted to run on general purpose digital signal processors have the advantage of better flexibility than hardware implementations, since the software can be readily reprogrammed. Conversely, hardware implementations of the Viterbi algorithm using application specific integrated circuits (ASICs) can achieve higher performance than the software implementations in terms of lower power consumption, higher decoding rates, etc., but cannot be easily modified.

It would therefore be advantageous to develop a method and apparatus for convolution encoding and Viterbi decoding that addresses these limitations of known hardware and software implementations. More specifically, it would be advantageous to develop a method and apparatus for convolution encoding and Viterbi decoding that has the flexibility of the software implementations, with the superior performance of the hardware implementations.

SUMMARY OF THE INVENTION

A method and apparatus for convolution encoding and Viterbi decoding utilizes a flexible, digital signal processing architecture that comprises a core processor and a plurality of re-configurable processing elements arranged in a two-dimensional array. The present invention therefore enables the convolution encoding and Viterbi decoding functions to be mapped onto this flexible architecture, thereby overcoming the disadvantages of conventional hardware and software solutions.

In an embodiment of the invention, the core processor is operable to configure the re-configurable processing elements to perform data encoding and data decoding functions. A received data input is encoded by configuring one of the re-configurable processing elements to emulate a convolution encoding algorithm and applying the received data input to the convolution encoding algorithm. A received encoded data input is decoded by configuring the plurality of re-configurable processing elements to emulate a Viterbi decoding algorithm wherein the plurality of re-configurable processing elements is configured to accommodate every data state of the convolution encoding algorithm. The core processor initializes the re-configurable processing elements by assigning register values to registers that define parameters such as constraint length and code rate for the convolution encoding algorithm.

More particularly, the encoding function further comprises generating a multiple output sequence corresponding to the received data input. Essentially, the encoding function comprises performing a modulo-two addition of selected taps of a serially time-delayed sequence of the received data input. The decoding function further comprises mapping a trellis diagram onto the plurality of re-configurable processing elements. The re-configurable processing elements calculate cumulative branch metric units for each node of the trellis diagram, and the core processor selects a most probable state transition path of the trellis diagram based on the branch metric units.

A more complete understanding of the method and apparatus for convolution encoding and Viterbi decoding will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention is directed towards a method and apparatus for convolution encoding and Viterbi decoding. In particular, this invention provides a unique re-configurable architecture that addresses the performance limitations currently known in the art by simultaneously achieving the flexibility of software pertaining to general-purpose processors and sustaining the high performance pertaining to hardware implementations of application-specific circuits. In the detailed description that follows, it should be appreciated that like element numerals are used to describe like elements illustrated in one or more of the figures.

Figure 2:
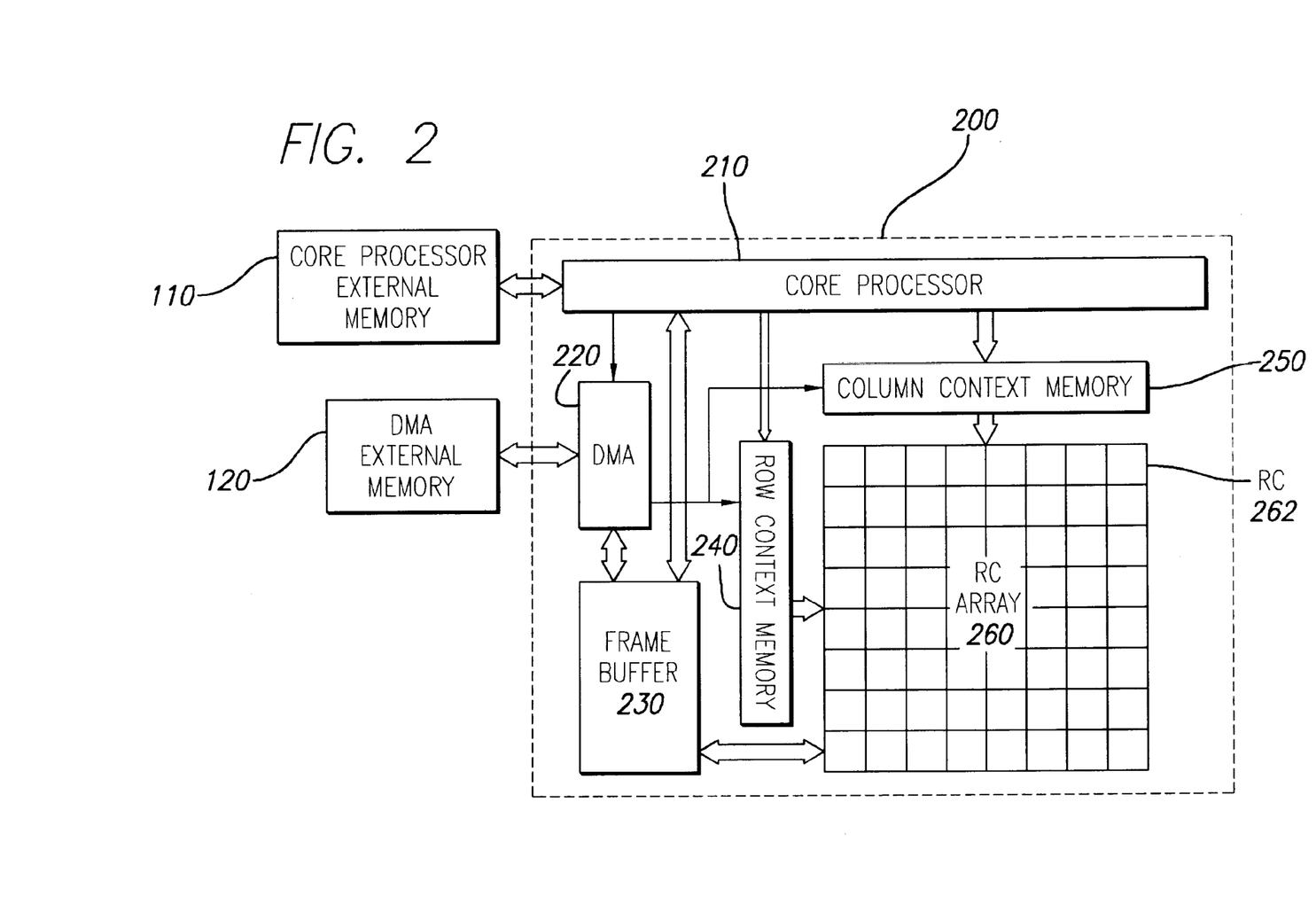
FIG. 2 is a block diagram of a preferred embodiment of the invention.

An embodiment of the invention shown in FIG. 2 comprises an architecture including a dynamically re-configurable two-dimensional SIMD processor array 200. In particular, this architecture is comprised of a core processor 210, a re-configurable cell (RC) array 260, a row context memory 240, a column context memory 250, a frame buffer 230, and a direct memory access (DMA) controller 220. As illustrated, the core processor 210 communicates with the core processor external memory unit 110 while the DMA controller 220 communicates with the DMA external memory unit 120. It should be appreciated that instructions and data for both the core processor 210 and the DMA controller 220 are respectively provided by external memory units 110 and 120. Reconfiguration, for example, is achieved by caching several context words from the DMA external memory unit 120 onto the row and column context memories, 240 and 250, of the processor array 260.

In a preferred embodiment of this invention, the core processor 210 and the DMA controller 220 respectively communicate with external memory units, 110 and 120, through parallel data-buses (e.g., 32-bit). A parallel data-bus (e.g., 32-bit) also connects the core processor 210 with the frame buffer 230, and the DMA controller 220 with both the row context memory 240 and the column context memory 250. Another parallel data-bus (e.g., 128-bit) connects the DMA controller 220 with the frame buffer 230, as well as the frame buffer 230 and the RC array 260. The row context memory 240 and the column context memory 250 are then both connected to the RC array 260 through a parallel context-bus (e.g., 256-bit) in both column and row direction.

Figure 3A:
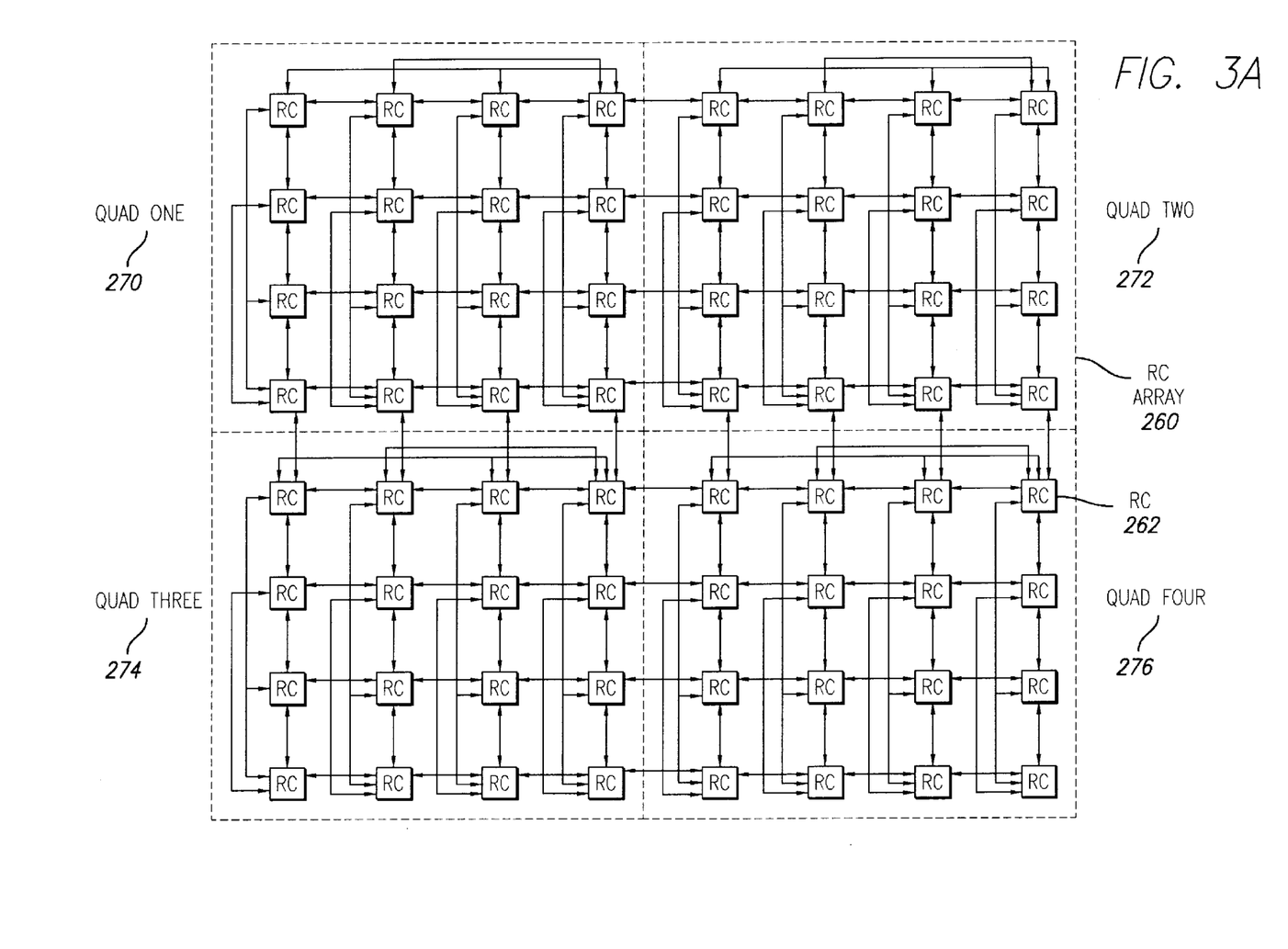
FIG. 3A is a schematic diagram illustrating the internal quadrants of the RC array.
Figure 3B:
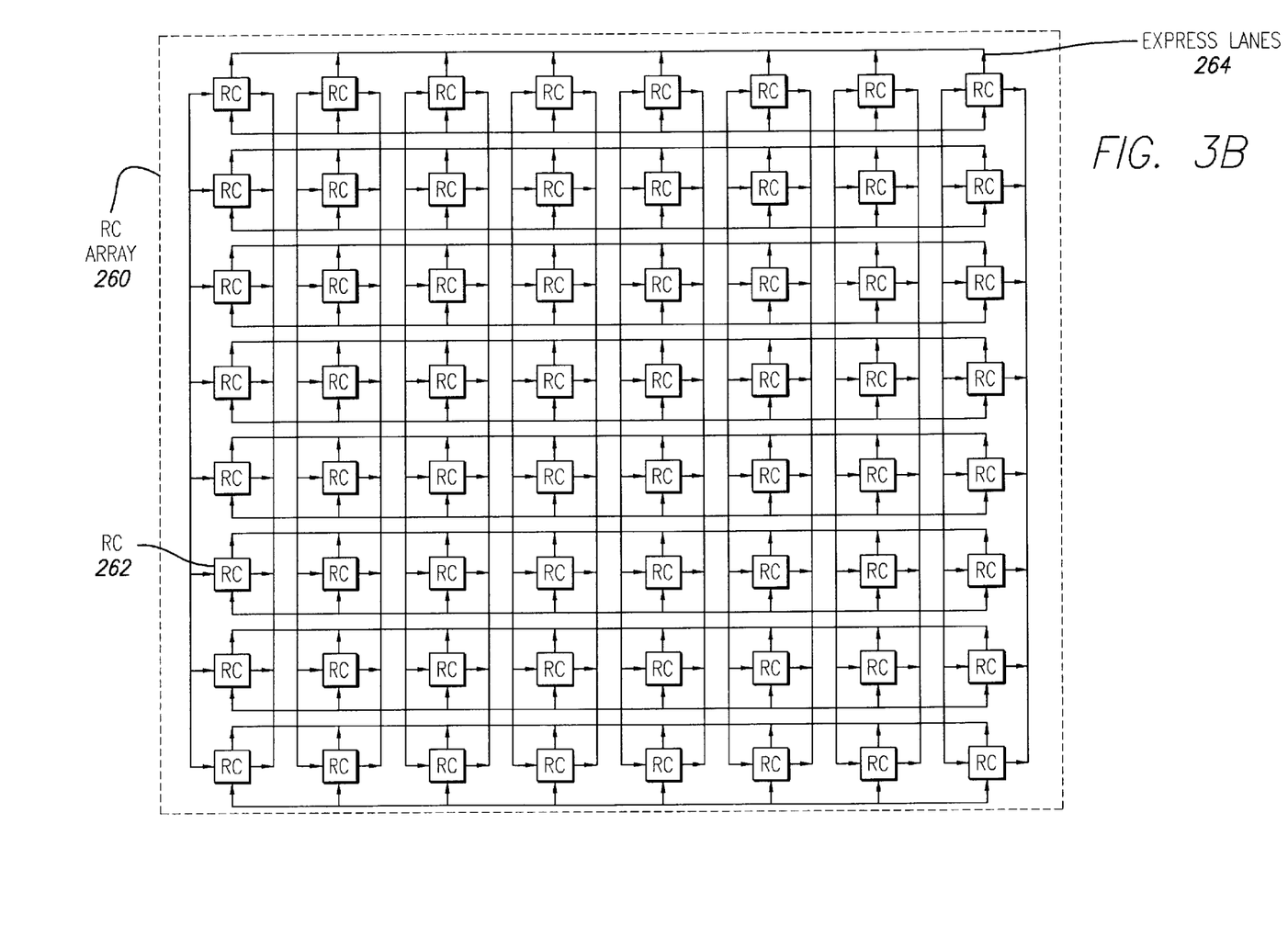
FIG. 3B is a schematic diagram illustrating the internal express lanes of the RC array.
Figure 3C:
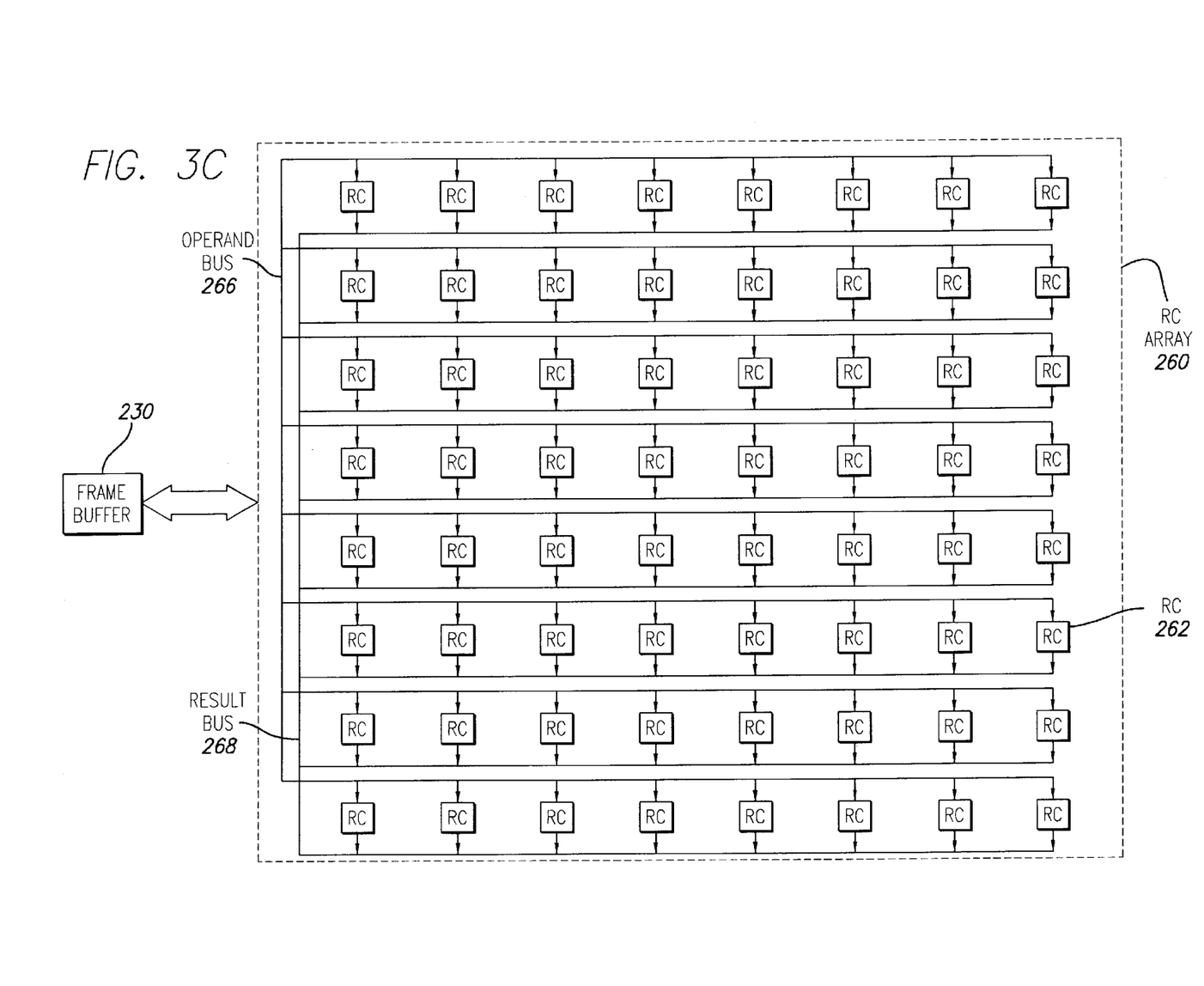
FIG. 3C is a schematic diagram illustrating the internal data-bus connections of the RC array.

In FIG. 3A, a diagram illustrating the internal connections of the RC array 260 is provided. In particular, RC's 262 in the RC array 260 are connected in two levels of hierarchy. First, cells are grouped into four quadrants, quad one 270, quad two 272, quad three 274, and quad four 276, in which RC's 262 of a particular quadrant are directly connected to each RC 262 in the row or column of that quadrant. Furthermore, cells in adjacent quadrants are connected via express lanes 264, that enable a cell in a quadrant to broadcast its results to the cells in the adjacent quadrant as illustrated in FIG. 3B. Each RC 262 of a particular row (i.e., eight RC's 262 per row in this particular embodiment) is also further comprised of two sixteen-bit connections allowing it to communicate with the frame buffer 230 both via a one-hundred-twenty-eight-bit operand bus 266 and a one-hundred-twenty-eight-bit result bus 268 as illustrated in FIG. 3C.

Returning to the architecture illustrated in FIG. 2, the function of each component is now described. The processing element of this invention is called the re-configurable cell (RC) 262. In this particular embodiment, a total of sixty-four RC's 262 are grouped into an eight by eight matrix, called the RC array 260. It should be noted that alternative embodiments of this RC array 260 can be created by grouping a total of m RC's 262 into an n×n matrix (where m is an arbitrary number of RC's defined by the product of n times n). The function of the frame buffer 230 is analogous to an internal data cache for the RC array 260. The row context memory 240 and the column context memory 250 are then both used to locally store the configuration contexts of the RC array 260, thus making their function analogous to an instruction cache for the RC array 260. The core processor 210 ultimately controls operation of the RC array 260. It initiates all data transfers to and from the frame buffer 230 and configures the loading of the row and column context memories, 240 and 250, through the DMA controller 220. It should be noted, however, that the core processor 210 instead of the RC array 260 calculates some computations. For example, the core processor 210 computes the traceback procedure of the Viterbi decoder, as will be described later.

The programmability of this architecture is derived from context words that are broadcast to the rows or columns of the RC array 260 by either the row context memory 240 or the column context memory 250. Depending on the context word, each RC 262 can access the output of any other RC 262 in its column or row, select an input from its own register file, or access data from the frame buffer 230. The context word thus provides functional programmability by configuring each RC 262 to perform specific operations.

Figure 4A:
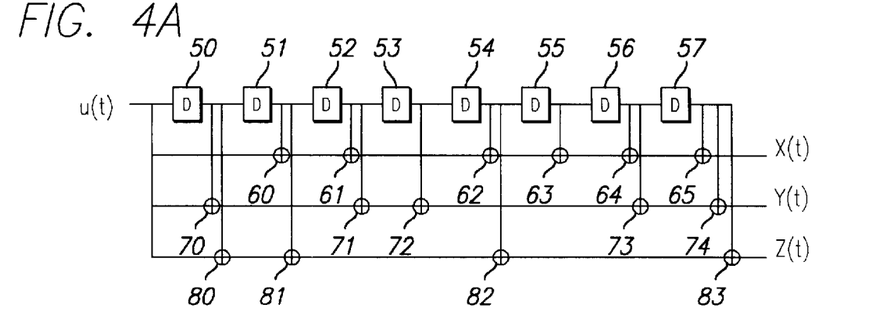
FIG. 4A is a schematic diagram of a convolution encoder having a code rate of one third and constraint length of nine.

A method in accordance with an embodiment of this invention is described for the case of a standard convolutional code, with a constraint length of nine and a code rate of one third, obtained by means of an exemplary coder shown in FIG. 4A. It should be understood that the decoding method and apparatus presented by this invention may be applied to all convolutional codes having code rates of $\eta=1/K$ (where K is an integer>1) and varying constraint lengths, by a simple generalization of the described method. As illustrated, convolution encoding involves the modulo-two addition of selected taps of a serially time-delayed data sequence. As illustrated in FIG. 4A, an input u(t) is passed through a series of eight delay elements 50, 51, 52, 53, 54, 55, 56, and 57 each of which is appropriately summed by several exclusive-OR operators 60, 61, 62, 63, 64, 65, 70, 71, 72, 73, 74, 80, 81, 82, and 83. Consequently, this operation generates a three-output sequence, X(t), Y(t), and Z(t), corresponding to a particular input u(t).

Figure 4B:
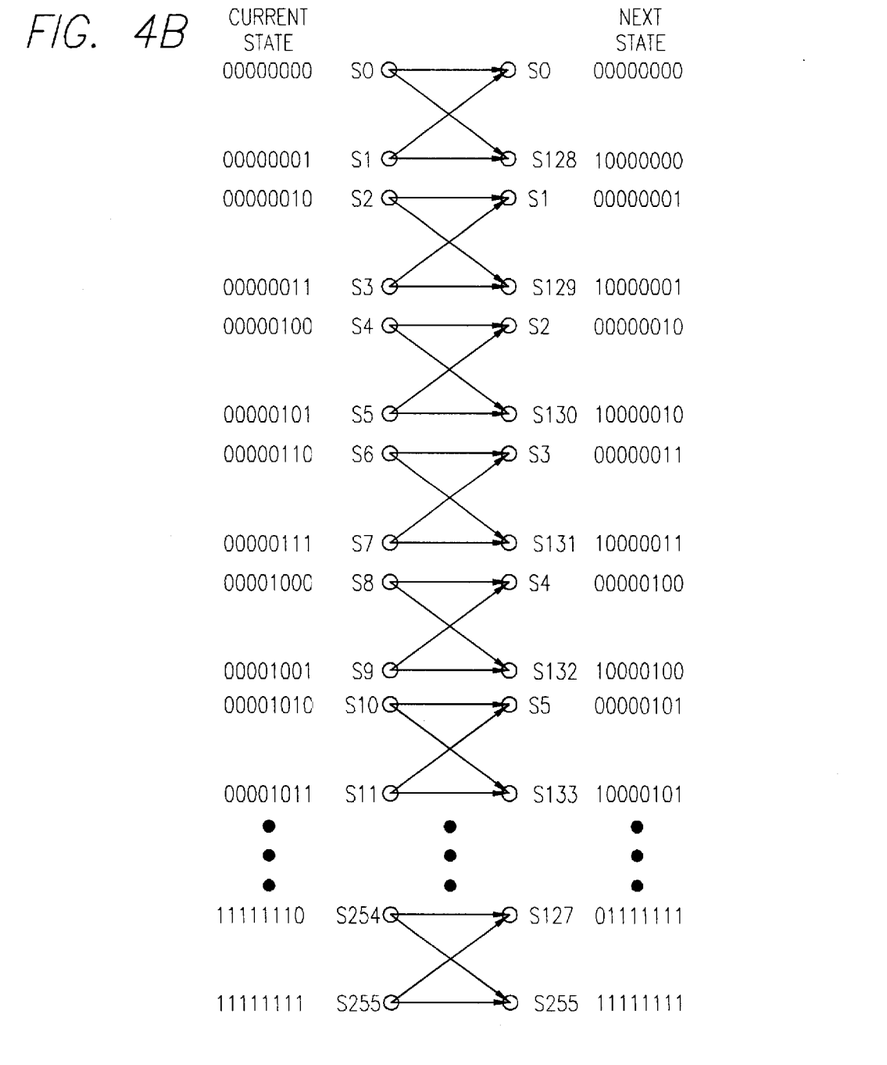
FIG. 4B is a trellis diagram illustrating the possible state transitions of encoded data having a code rate of one third and constraint length of nine.

The dynamics of this coder are described by the diagram of the trellis shown in FIG. 4B and are well known in the art. For this particular example, it is shown that for each of the two hundred fifty six possible current states, there are two potential state transition paths that can be taken into the next state. For example, if a zero input u(t) is passed through the coder when the current state is zero (S0), the resultant output $(X_0, Y_0, Z_0)$ is (0, 0, 0) and the resultant next state is state zero (S0). In this same example, if an input u(t) of one is passed through the coder, the resultant output is (1, 1, 1) and the resultant next state is state one hundred twenty-eight (S128). It should be noted that, for simplicity, the trellis shown in FIG. 4B corresponds to only one of several trellis stages (namely, only one set of state transitions).

Figure 5:
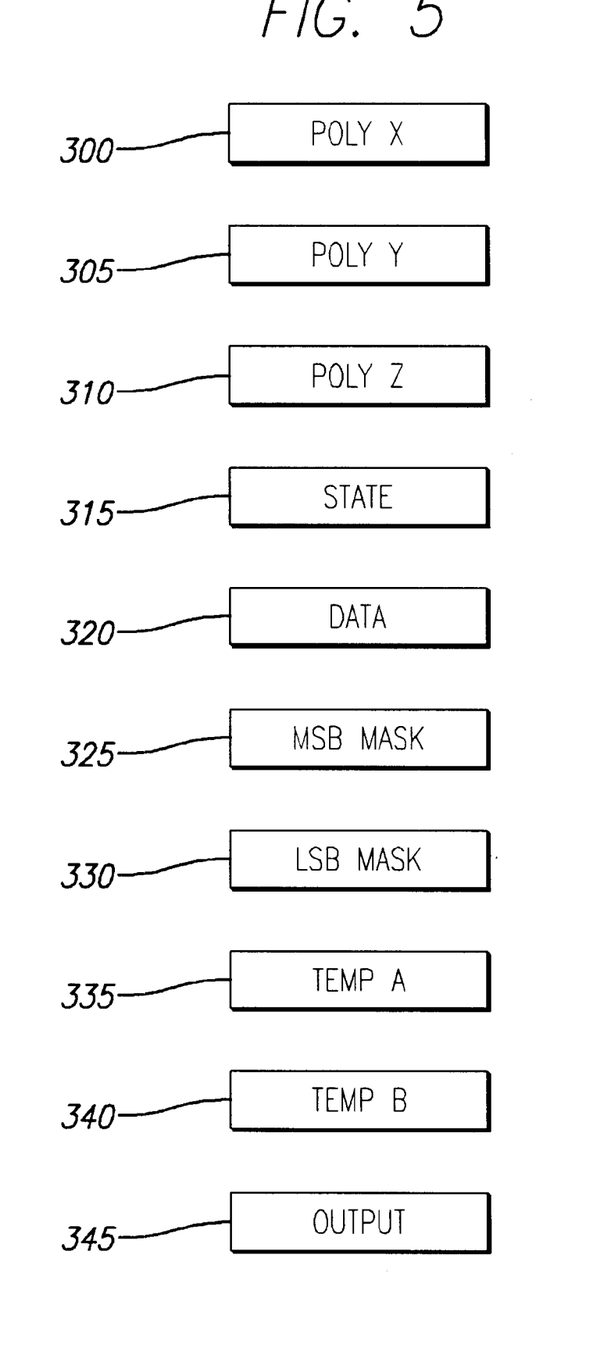
FIG. 5 is a diagram illustrating the various registers allocated for encoding in an RC.

In a preferred embodiment of the present invention, only one RC 262 is needed for convolution encoding. During this time, all other RC's 262 are shut off in order to conserve power. FIG. 5 provides a schematic diagram illustrating how internal memory space is allocated for one third code rate encoding in the single functional RC 262. In particular, various registers 300, 305, 310, 315, 320, 325, 330, 335, 340, and 345 are used to perform this encoding operation. Registers 300, 305, and 310 are reserved for polynomial values X, Y, and Z corresponding to the respective outputs X(t), Y(t), and Z(t) of the encoder shown in FIG. 4A. It should be noted that these polynomial values are usually programmed into these registers according to industry standards for convolution encoders. For example, conventional 3G wireless standards define these values as being 557 (octal), 663 (octal), and 711 (octal), for X, Y, and Z, respectively. Register 315 is reserved for the current eight-bit state of the encoder (corresponding to the eight delay elements 50, 51, 52, 53, 54, 55, 56, and 57 of FIG. 4A) while register 320 is reserved for the actual data to be encoded (entered sixteen-bits at a time). Registers 325 and 330 are used as masks to respectively extract the most and least significant bits from other registers. Registers 335 and 340 are then used to temporarily store intermediate values ascertained during the encoding procedure. Finally, register 345 is used to store the three-output sequence (X(t), Y(t), Z(t)) of encoded values.

Figure 6:
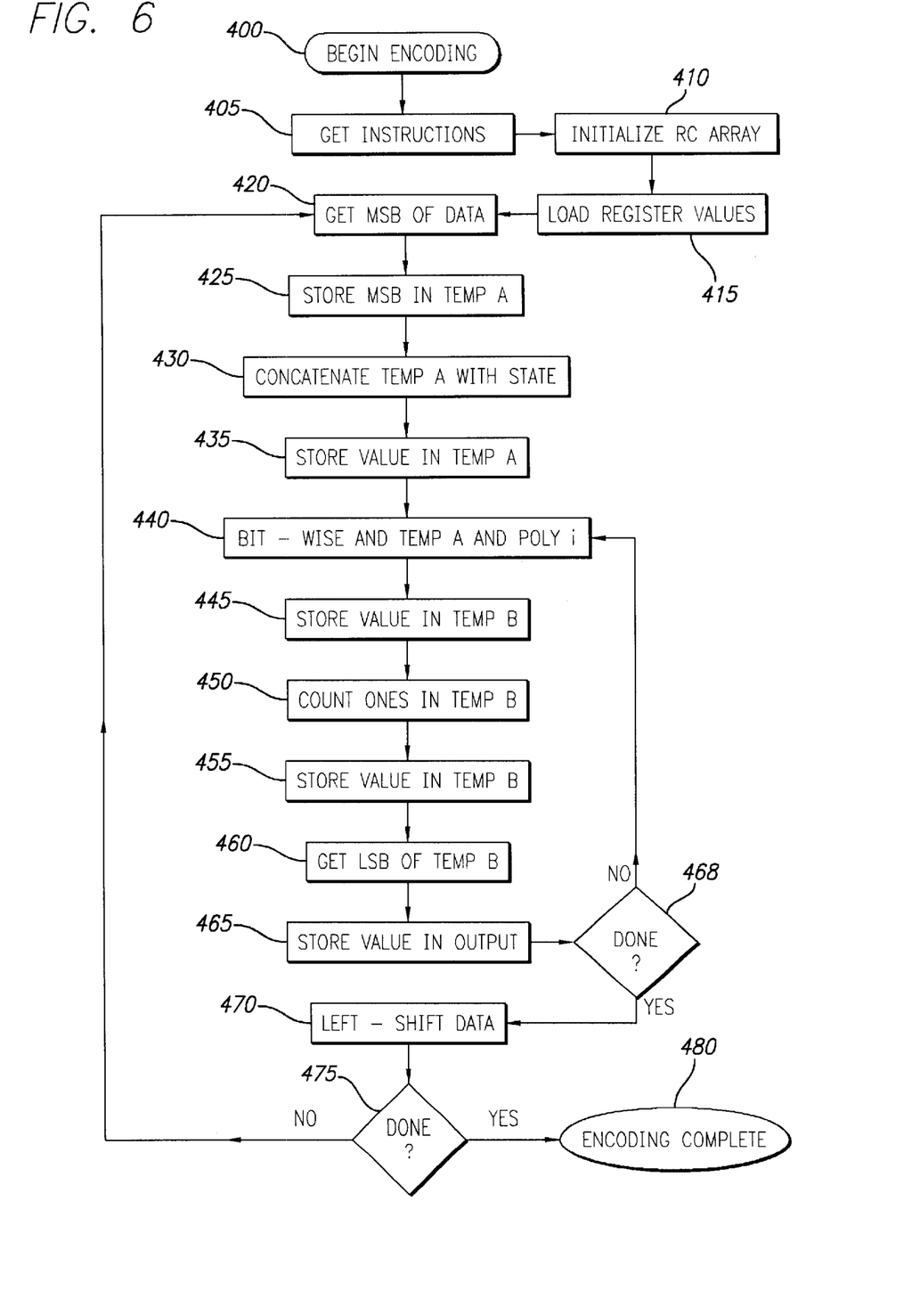
FIG. 6 is a flow chart illustrating the steps for encoding one bit of information according to a preferred embodiment of the invention.

In FIG. 6, a flow chart describing the encoding procedure for one bit of data is provided. Encoding begins at step 400 and continues with the core processor 210 getting encoding instructions from external memory unit 110 at step 405. The core processor 210 then proceeds by initializing the RC array 260 for the encoding procedure at step 410. This initialization step includes allocating the internal memory space described previously (here, it is assumed that a code rate of one third is desired). At step 415, register values are appropriately loaded into each of the registers illustrated in FIG. 5. Next, the most significant bit (MSB) is taken from the data register 320 at step 420 and temporarily stored in temporary register 335 (where it is understood that the MSB is extracted from the data register 320 through a simple logic operation with the MSB mask stored in register 325) at step 425. The stored MSB value is then concatenated with the value stored in the state register 315 at step 430. The value derived at step 430 is then temporarily stored back into temporary register 335 at step 435. At step 440, a bit-wise AND operation is performed between the value stored in temporary register 335 and the appropriate value representing polynomial i stored in either register 300, 305, or 310 (where it is understood that this step will alternate these three values at each respective iteration). The result of the operation performed at step 440 is then stored in temporary register 340 at step 445. The RC 262 then performs a "ones" counter operation on the value stored in temporary register 340 at step 450 and stores this value back into temporary register 340 at step 455. The least significant bit (LSB) is then extracted from the value stored in temporary register 340 at step 460 using the LSB mask stored in register 330. The LSB found at step 460 represents the encoded output corresponding to the polynomial used at step 440. This value is then stored in the output register 345 at step 465. At step 468, it is then determined whether encoding for this particular bit is complete (i.e., if there are three encoded values). If, at step 468, it is determined that encoding for this particular bit is complete, then the data register is left-shifted by one at step 470 in preparation for encoding the next bit; otherwise, encoding of the current bit continues by returning the procedure to step 440 where calculations are made according to the next polynomial value. At step 475, the core processor 210 then determines if the encoding is complete. After left-shifting the data register at step 470, the procedure determines whether the entire encoding process is complete (i.e., there is no further data to be encoded) at step 475. If at step 475, it is determined that encoding is complete, then the encoded stream of values is provided to the frame buffer 230 at step 480; otherwise, the procedure returns to step 420 where it proceeds in determining the next encoded set of values.

Figure 7:
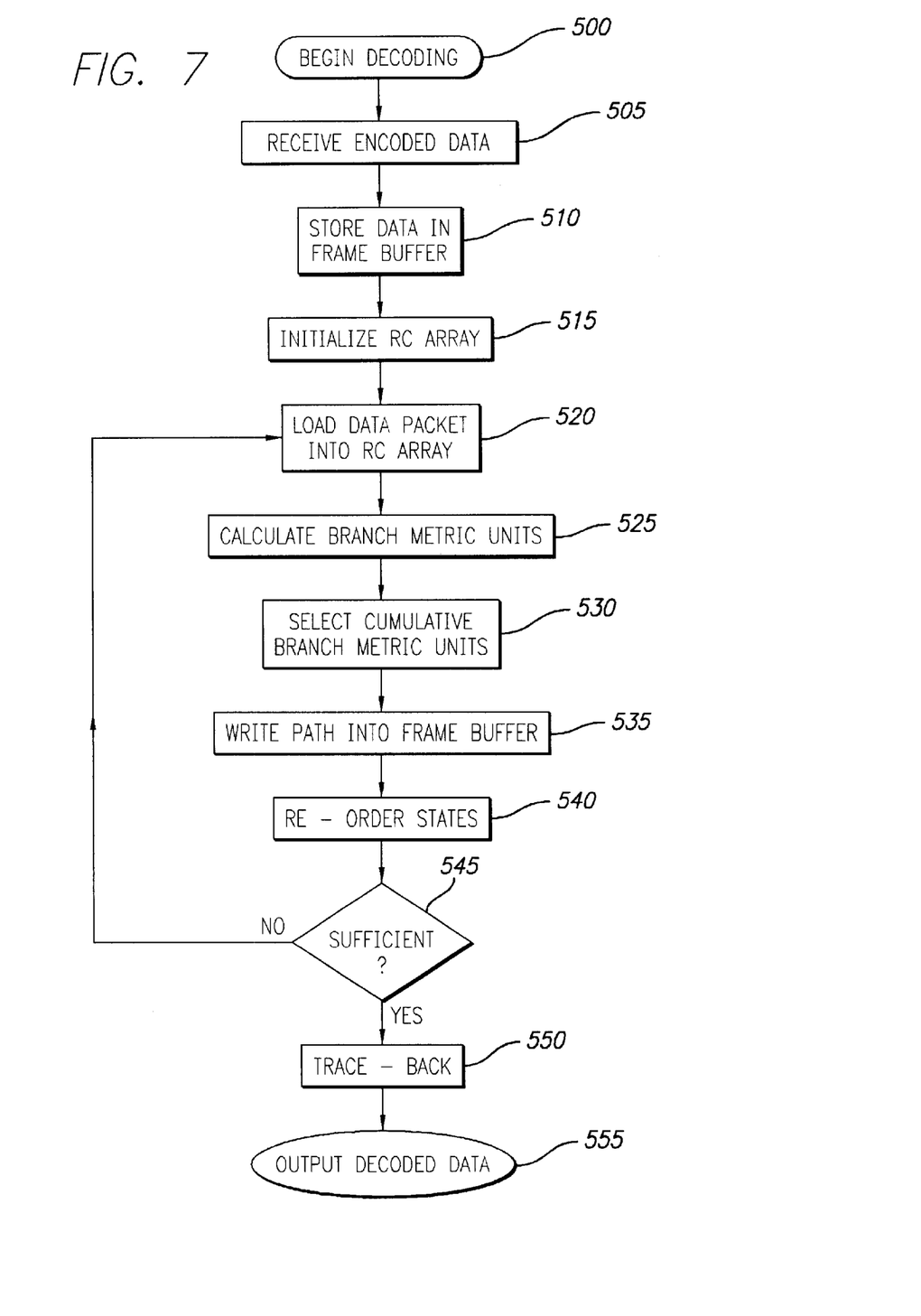
FIG. 7 is a flow chart illustrating the steps for decoding a bit stream of information according to a preferred embodiment of the invention.
Figure 8:
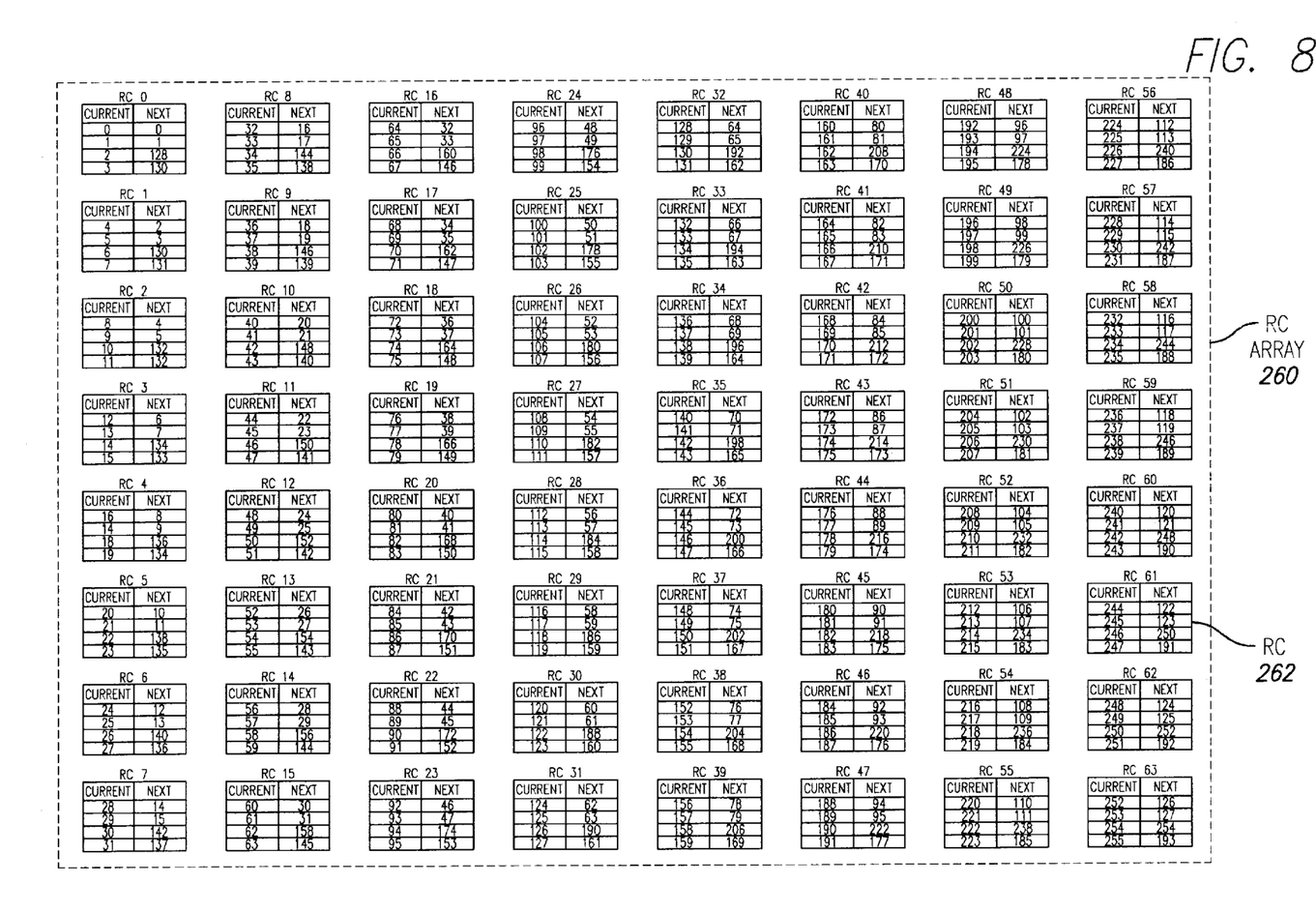
FIG. 8 is diagram illustrating the state transition mapping of a Viterbi decoder for encoded data having a code rate of one third and a constraint length of nine.

In FIG. 7, a flow chart illustrating the steps for decoding a bit-stream of encoded data is shown. For simplicity, the mapping of the Viterbi decoder onto the aforementioned RC array 260 is herein described for encoded data with constraint lengths of nine (corresponding to $2^8$ states) and code rates of one-third, which correspond to typical standards used in the art. However, it should be noted that the following mapping methods can be easily adapted for Viterbi decoders with different constraint lengths and different code rates through minor software modifications. This flexibility, therefore, enables the present invention to re-configure itself without having to make any hardware modifications. Decoding begins at step 500 and continues with the reception of an encoded stream of data that is temporarily stored in the DMA external memory unit 120 at step 505. The DMA controller 220 then transfers this encoded data from the external memory unit 120 to the frame buffer 230 at step 510. The core processor 210 then determines the format of the incoming data (e.g., code rate, constraint length, etc.), and initializes the RC array 260 according to this format at step 515. For this particular example, the RC array 260 must be initialized according to data having a constraint length of nine and having a code rate of one-third. Since these specifications result in a total of two hundred fifty six states, each RC 262 is assigned trellis information for four states as shown in FIG. 8. At step 520, a particular instruction is selected from the row context memory 240 enabling the first encoded packet of data ($X_0$, $Y_0$, $Z_0$) to be loaded into each RC 262 of the RC array 260.

Figure 9:
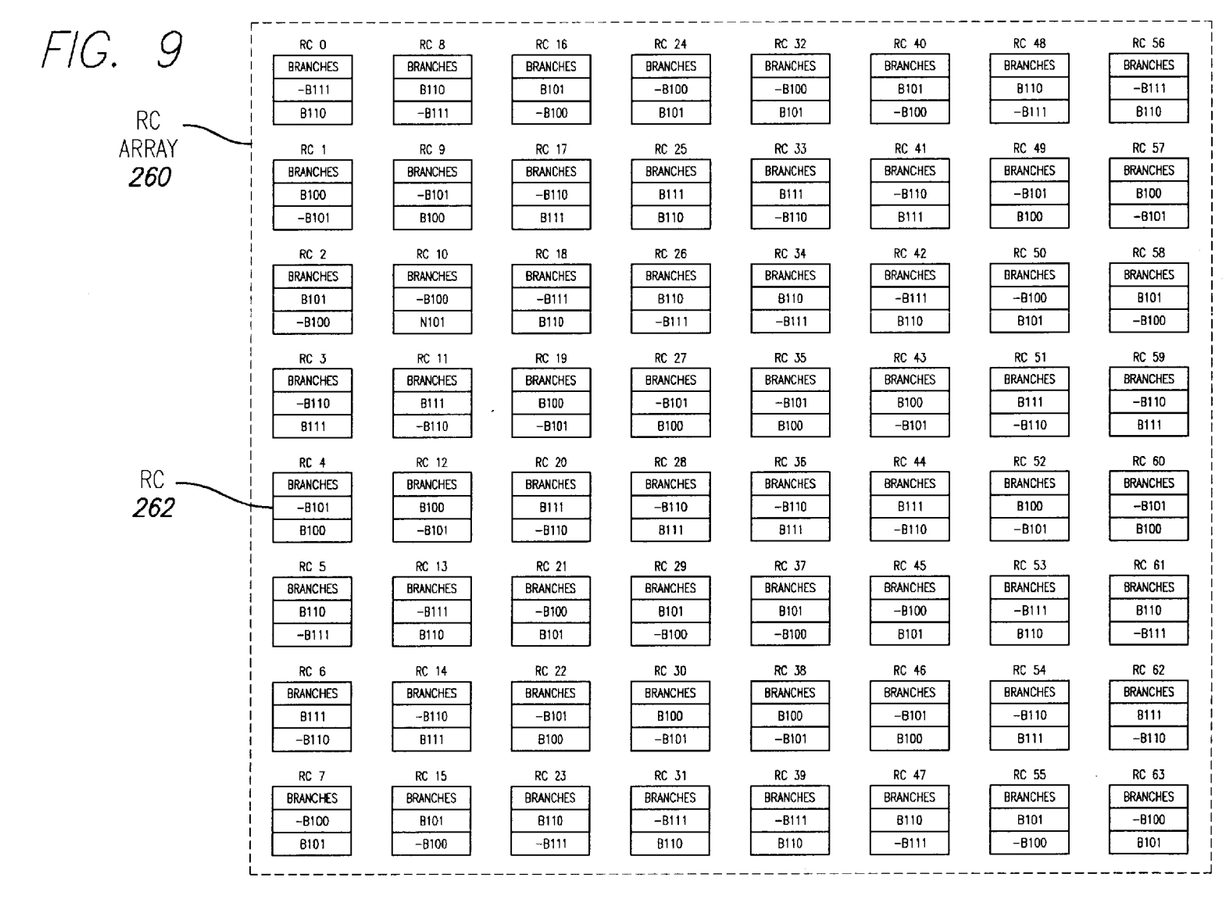
FIG. 9 is a diagram illustrating the branch metric mapping of a Viterbi decoder for encoded data having a code rate of one third and a constraint length of nine.

Once this first packet of data is loaded into the RC array 260, branch metric calculations may begin at step 525. According to the branch metric assignments shown in FIG. 9, each RC 262 will calculate its respective branch metrics (two branch metrics per RC 262) and store them in its local memory. It should be noted that, in general:

$$\text{Branch}(a_s, b_s, c_s) = -\text{Branch}(-a_s, -b_s, -c_s),$$

where $-a_s$, $-b_s$, and $-c_s$ are the respective binary inverses of $a_s$, $b_s$, and $c_s$. This simplification is well-known in the art and is implemented as shown in FIG. 9. The procedure continues at step 530 by selecting the most probable path for each state at this particular trellis stage. Namely, at step 530, each RC 262 sums the calculated branch metric from step 525 with the cumulative branch metric of the corresponding state from the previous trellis stage and compares its two possible paths (as shown in FIG. 4B). Since each state has only two possible paths, one bit can be used to describe which path was chosen. The calculated sum corresponding to the most probable path of each state is then assigned to the next state respectively described by each of these paths. These cumulative branch metrics are then stored locally in each RC 262 until the next trellis stage. Thus, for each node of the trellis, both a cumulative branch metric value and a path-defining value is stored.

Figure 10:
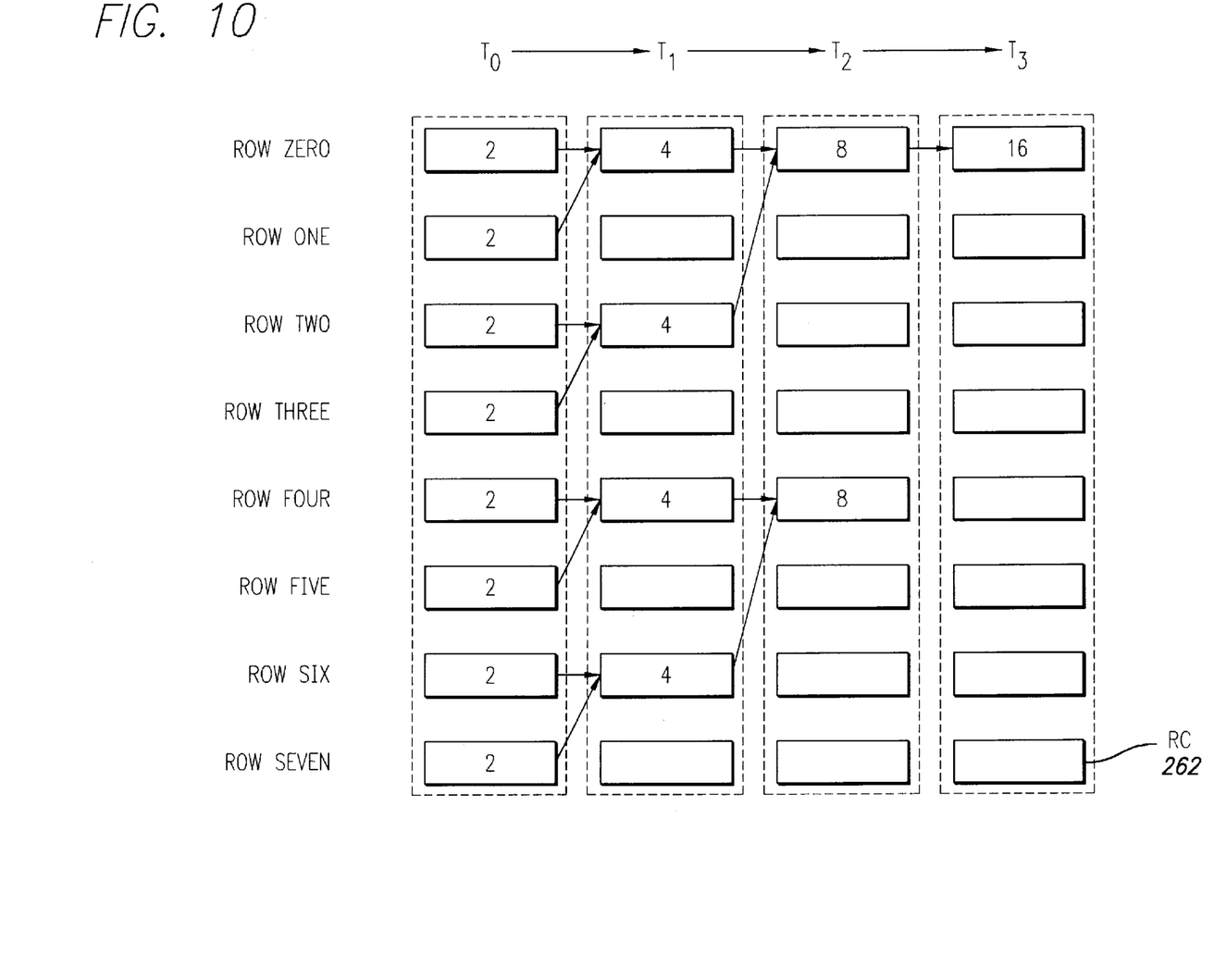
FIG. 10 is a schematic diagram demonstrating the data collapse procedure for writing path information into the frame buffer.

Next, the selected path is recorded and written back to the frame buffer 230 at step 535. Since each RC 262 has four bits of data that need to be stored in the frame buffer 230, each column of the RC array 260 will have a total of thirty-two bits requiring storage in the frame buffer 230. In order to pass this data through the sixteen-bit result-bus 268, a data collapse mechanism is implemented at each column by broadcasting particular instructions from either the row context memory 240 or the column context memory 250. This mechanism merges the first two bits of each RC 262 into a single sixteen-bit word and then takes the remaining two bits of each RC 262 and merges them into another sixteen-bit word. In FIG. 10, this mechanism is described for one of the eight columns of the RC array 260.

As illustrated, this process begins by taking the first two bits of each RC 262 and merging them with the first two bits of a neighboring RC 262 to form a set of four four-bit words. In particular, the first two bits of rows zero and one, two and three, four and five, and six and seven are respectively merged in order to create this set of four-bit words. Each four-bit word is then respectively stored in one particular RC 262 of the aforementioned RC 262 pairs. In the example shown, these four-bit words are respectively stored in rows zero, two, four, and six. A similar mechanism then follows in order to merge this set of four four-bit words into a set of two eight-bit words. In particular, the two four-bit words in rows zero and two merge to form the eight-bit word shown in row zero while the two four-bit words in rows four and six merge to form the eight-bit word shown in row four. The two eight-bit words are then merged to form the sixteen-bit word shown in row zero. The sixteen-bit word is then sent to the frame buffer 230 via the result-bus 268. Once this first sixteen-bit word is stored in the frame buffer 230, operations may begin to create the second sixteen-bit word through the same procedure.

Returning to the flow chart illustrated in FIG. 7, a re-ordering of the state metrics is then made at step 540. The purpose of this step is to prepare the RC array 260 for the next trellis stage. In order for this to occur, the branch metric values calculated and assigned to each "next state" at step 530 must be updated so that they are labeled "current state" branch metric values in the following trellis stage. It should be noted that the core processor 210 catalyzes this state re-ordering procedure by broadcasting particular instructions from either the row context memory 240 or the column context memory 250. By way of these instructions, cumulative branch metric values are easily communicated from one RC 262 to another.

After updating these branch metric values at step 540, an internal criterion algorithm determines whether an additional trellis stage is needed at step 545 (where it is understood that either of the two aforementioned trace-back approaches may be used). If at step 545, it is indeed determined that an additional trellis stage is needed, the procedure returns to step 520 and thus repeats the above iteration for the following trellis stage; otherwise, the procedure initiates its trace-back operation at step 550. Once this trace-back operation is initiated, the core processor 210 selects the optimal path from the plethora of paths stored in the frame buffer 230. In a known way, the core processor 210 then takes this optimal path and determines which bit stream was most likely transmitted by the encoder. This decoded bit stream is then output to the frame buffer 230 at step 555.

Having thus described a preferred embodiment of the method and apparatus for convolution encoding and Viterbi decoding, it should be apparent to those skilled in the art that certain advantages of the within system have been achieved. It should also be appreciated that various modifications, adaptations, and alternative embodiments thereof may be made within the scope and spirit of the present invention. The invention is further defined by the following claims.

What is claimed is:

1. In a digital signal processing architecture comprising a core processor-and a plurality of re-configurable processing elements arranged in a two-dimensional array, a method for processing digital data comprises the steps of:

encoding a received data input by utilizing said processor to configure one of said re-configurable processing elements to emulate a convolution encoding algorithm and applying said received data input to said convolution encoding algorithm to produce an encoded data output; and decoding a received encoded data input by utilizing said processor to configure said plurality of re-configurable processing elements to emulate a Viterbi decoding algorithm, wherein said plurality of re-configurable processing elements is configured to accommodate every data state of said convolution encoding algorithm, and applying said received encoded data input to said Viterbi decoding algorithm to produce a decoded data output.

2. The method of claim 1, wherein said decoding step further comprises mapping a trellis diagram onto said plurality of re-configurable processing elements.

3. The method of claim 2, wherein said decoding step further comprises calculating branch metric units from within said plurality of re-configurable processing elements.

4. The method of claim 3, wherein said decoding step further comprises selecting a most probable state transition path of said trellis diagram.

5. The method of claim 3, wherein said decoding step further comprises summing said branch metric units for each node of said trellis diagram.

6. In a digital signal processing architecture comprising a core processor and a plurality of re-configurable processing elements arranged in a two-dimensional array, a method for processing digital data comprises the steps of:

encoding a received data input by configuring one of said re-configurable processing elements to emulate a convolution encoding algorithm and applying said received data input to said convolution encoding algorithm to produce an encoded data output; and decoding a received encoded data input by configuring said plurality of re-configurable processing elements to emulate a Viterbi decoding algorithm, wherein said plurality of re-configurable processing elements is configured to accommodate every data state of said convolution encoding algorithm, and applying said received encoded data input to said Viterbi decoding algorithm to produce a decoded data output;

wherein said encoding step further comprises initializing said one of said re-configurable processing elements by assigning register values to registers that define at least one of constraint length and code rate for said convolution encoding algorithm.

7. In a digital signal processing architecture comprising a core processor and a plurality of re-configurable processing elements arranged in a two-dimensional array, a method for processing digital data comprises the steps of:

encoding a received data input by configuring one of said re-configurable processing elements to emulate a convolution encoding algorithm and applying said received data input to said convolution encoding algorithm to produce an encoded data output; and decoding a received encoded data input by configuring said plurality of re-configurable processing elements to emulate a Viterbi decoding algorithm, wherein said plurality of re-configurable processing elements is configured to accommodate every data state of said convolution encoding algorithm, and applying said received encoded data input to said Viterbi decoding algorithm to produce a decoded data output;

wherein said encoding step further comprises generating a multiple output sequence corresponding to said received data input.

8. In a digital signal processing architecture comprising a core processor and a plurality of re-configurable processing elements arranged in a two-dimensional array, a method for processing digital data comprises the steps of:

encoding a received data input by configuring one of said re-configurable processing elements to emulate a convolution encoding algorithm and applying said received data input to said convolution encoding algorithm to produce an encoded data output; and decoding a received encoded data input by configuring said plurality of re-configurable processing elements to emulate a Viterbi decoding algorithm, wherein said plurality of re-configurable processing elements is configured to accommodate every data state of said convolution encoding algorithm, and applying said received encoded data input to said Viterbi decoding algorithm to produce a decoded data output;

wherein said encoding step further comprises performing a modulo-two addition of selected taps of a serially time-delayed sequence of said received data input.

9. In a digital signal processing architecture comprising a core processor and a plurality of re-configurable processing elements arranged in a two-dimensional array, a method for processing digital data comprises the steps of:

encoding a received data input by configuring one of said re-configurable processing elements to emulate a convolution encoding algorithm and applying said received data input to said convolution encoding algorithm to produce an encoded data output; and decoding a received encoded data input by configuring said plurality of re-configurable processing elements to emulate a Viterbi decoding algorithm, wherein said plurality of re-configurable processing elements is configured to accommodate every data state of said convolution encoding algorithm, and applying said received encoded data input to said Viterbi decoding algorithm to produce a decoded data output;

wherein said decoding step further comprises initializing said plurality of re-configurable processing elements by assigning values to registers that define at least one of constraint length and code rate for said Viterbi decoding algorithm.

10. In a digital signal processing architecture comprising a core processor and a plurality of re-configurable processing elements arranged in a two-dimensional array, a method for processing digital data comprises the steps of:

encoding a received data input by configuring one of said re-configurable processing elements to emulate a convolution encoding algorithm and applying said received data input to said convolution encoding algorithm to produce an encoded data output; and decoding a received encoded data input by configuring said plurality of re-configurable processing elements to emulate a Viterbi decoding algorithm, wherein said plurality of re-configurable processing elements is configured to accommodate every data state of said convolution encoding algorithm, and applying said received encoded data input to said Viterbi decoding algorithm to produce a decoded data output;

wherein each one of said plurality of re-configurable processing elements is configured to accommodate plural data states of said convolution encoding algorithm.

11. A digital signal processing architecture comprising:

a plurality of re-configurable processing elements arranged in a two-dimensional array, said plurality of re-configurable processing elements are programmable in response to predetermined context words; and a processor operatively coupled to said plurality of re-configurable processing elements to control loading of said predetermined context words thereto, said processor being selectively operable to configure one of said re-configurable processing elements to emulate a convolution encoding algorithm, and to configure said plurality of re-configurable processing elements to emulate a Viterbi decoding algorithm wherein said plurality of re-configurable processing elements accommodates every data state of said convolution encoding algorithm;

wherein, a received data input applied to said convolution encoding algorithm produces an encoded data output, and a received encoded data input applied to said Viterbi decoding algorithm produces a decoded data output.

12. The digital signal processing architecture of claim 11, wherein said processor is further operable to initialize said one of said re-configurable processing elements by assigning register values to registers that define at least one of constraint length and code rate for said convolution encoding algorithm.

13. The digital signal processing architecture of claim 11, wherein said encoded data output further comprises a multiple output sequence corresponding to said received data input.

14. The digital signal processing architecture of claim 11, wherein said one of said re-configurable processing elements further emulates a serially time-delayed sequence having plural taps having said received data input applied thereto, and said encoded data output further comprises a modulo-two addition of said selected taps.

15. The digital signal processing architecture of claim 11, wherein said processor is further operable to map a trellis diagram onto said plurality of re-configurable processing elements.

16. The digital signal processing architecture of claim 15, wherein said processor is further operable to configure said plurality of re-configurable processing elements to calculate branch metric units.

17. The digital signal processing architecture of claim 16, wherein said processor is further operable to select a most probable state transition path of said trellis diagram.

18. The digital signal processing architecture of claim 17, wherein said processor is further operable to configure said plurality of re-configurable processing elements to sum said branch metric units for each node of said trellis diagram.

19. The digital signal processing architecture of claim 11, wherein said processor is operable to initialize said plurality of re-configurable processing elements by assigning values to registers that define at least one of constraint length and code rate for said Viterbi decoding algorithm.

20. The digital signal processing architecture of claim 11, wherein said processor is operable to configure each one of said plurality of re-configurable processing elements to accommodate plural data states of said convolution encoding algorithm.

* * * * *